(12) United States Patent
Eom et al.

(10) Patent No.: US 8,211,745 B2
(45) Date of Patent: Jul. 3, 2012

(54) METHOD AND STRUCTURE FOR BONDING FLIP CHIP

(75) Inventors: Yong Sung Eom, Daejeon (KR); Jong Tae Moon, Gyeryong (KR); Kwang-Seong Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 131 days.

(21) Appl. No.: 12/761,715

(22) Filed: Apr. 16, 2010

(65) Prior Publication Data

US 2011/0089577 A1 Apr. 21, 2011

(30) Foreign Application Priority Data

Oct. 15, 2009 (KR) .................. 10-2009-0098239

(51) Int. Cl.
*H01L 21/60* (2006.01)
*H01L 21/44* (2006.01)
*H01L 23/498* (2006.01)

(52) U.S. Cl. . 438/108; 438/613; 257/778; 257/E21.511; 257/E23.068

(58) Field of Classification Search .......... None
See application file for complete search history.

(56) References Cited

U.S. PATENT DOCUMENTS

| | | | | |
|---|---|---|---|---|
| 5,968,670 | A * | 10/1999 | Brofman et al. | 428/576 |
| 6,042,894 | A * | 3/2000 | Goto et al. | 427/504 |
| 7,202,932 | B2 * | 4/2007 | Niwa et al. | 349/154 |
| 7,735,713 | B2 * | 6/2010 | Kataoka et al. | 228/180.22 |
| 7,880,315 | B2 * | 2/2011 | Beyne et al. | 257/780 |
| 2005/0104204 | A1 * | 5/2005 | Kawakubo et al. | 257/724 |
| 2005/0167036 | A1 * | 8/2005 | Yokoyama et al. | 156/230 |
| 2007/0221710 | A1 * | 9/2007 | Akamatsu et al. | 228/223 |
| 2008/0099916 | A1 * | 5/2008 | Chang et al. | 257/738 |
| 2008/0197173 | A1 | 8/2008 | Kitae et al. | |
| 2010/0001411 | A1 * | 1/2010 | Sawada et al. | 257/778 |
| 2010/0013032 | A1 * | 1/2010 | Oppermann et al. | 257/415 |

FOREIGN PATENT DOCUMENTS

| | | |
|---|---|---|
| EP | 1796155 A1 | 6/2007 |
| KR | 10-0692340 A | 3/2007 |
| KR | 10-2007-0052791 | 5/2007 |

OTHER PUBLICATIONS

Jong-Min Kim et al., "New Electrically Conductive Adhensives Filled with Low-Melting-Point Alloy Fillers" Materials Transactions, vol. 45, No. 1, pp. 157-160, 2004.

* cited by examiner

*Primary Examiner* — Seahvosh Nikmanesh
(74) *Attorney, Agent, or Firm* — Rabin & Berdo, P.C.

(57) ABSTRACT

Provided is a method and structure for bonding a flip chip while increasing the manufacturing yield. In the method, solder bumps are formed on first electrodes and/or second electrodes disposed on first and second substrates, respectively. In addition, the first and second electrodes are arranged to face each other with a second resin including spacer balls being disposed between the first and second substrates. In addition, while flowing the second resin, the first and second substrates are pressed until the distance between the first and second substrates is decreased smaller than diameter of the spacer balls so as to connect the solder bumps between the first and second electrodes.

20 Claims, 5 Drawing Sheets

METHOD AND STRUCTURE FOR BONDING FLIP CHIP

CROSS-REFERENCE TO RELATED APPLICATIONS

This U.S. non-provisional patent application claims priority under 35 U.S.C. §119 of Korean Patent Application No. 10-2009-0098239, filed on Oct. 15, 2009, the entire contents of which are hereby incorporated by reference.

BACKGROUND OF THE INVENTION

The present invention disclosed herein relates to a method and structure for bonding a flip chip, and more particularly, to a method and structure for bonding a flip chip by using a fine-structure solder bump.

Generally, electronic components such as semiconductor devices may be provided as commercial products in a state where they are mounted on a printed circuit board (PCB). Instead of additionally designing connection wires such as lead frames, the research and development of substrate-level package technology such as flip chip bonding technology are being conducted.

Flip chip bonding may be carried out by disposing a solder bump having a predetermined size on one of a plurality of electrodes formed on upper and lower substrates and aligning and pressing the upper and lower substrates. However, if such solder bumps have irregular sizes, it is difficult to maintain the distance between the upper and lower substrates uniformly or prevent contact defects of the solder bumps.

SUMMARY OF THE INVENTION

The present invention provides a method and structure for bonding a flip chip while keeping constant the distance between a plurality of mutually facing substrates.

The pressure invention also provides a method and structure for bonding a flip chip while preventing contact defects of solder bumps having irregular sizes.

Embodiments of the present invention provide methods for bonding a flip chip, the methods including: forming solder bumps on first electrodes and/or second electrodes disposed on first and second substrates, respectively; arranging the first and second electrodes to face each other with a second resin including spacer balls being disposed between the first and second substrates; and while flowing the second resin, pressing the first and second substrates until distance between the first and second substrates is decreased smaller than diameter of the spacer balls, so as to connect the solder bumps between the first and second electrodes.

In some embodiments, the solder bumps may have heights ranging from a maximum height to a minimum height.

In other embodiments, the minimum height of the solder bumps may correspond to an aspect ratio of 0.1 with respect to a size of the first electrodes or the second electrodes.

In still other embodiments, the maximum height of the solder bumps may correspond to an aspect ratio of 0.5 with reference to a size of the first electrodes or the second electrodes.

In even other embodiments, the pressing of the first and second substrates may include: pressing the first and second substrates with a first pressure so that the first and second substrates are spaced a first distance at which a solder bump having the maximum height is brought into contact with the first and second electrodes; pressing the first and second substrates with a second pressure higher than the first pressure so that the first and second substrates are spaced a second distance at which a solder bump having the minimum height is brought into contact with the first and second electrodes; and releasing the first and second substrates with a third pressure lower than the second pressure so that the first and second substrates are spaced a third distance greater than the second distance.

In yet other embodiments, in the releasing of the first and second substrates, the first and second substrates may be spaced the third distance greater than the second distance by resilience of the spacer balls.

In further embodiments, the second resin may be allowed to flow from the pressing of the first and second substrates with the first pressure to the pressing of the first and second substrates with the second pressure, and the second resin may be hardened from the pressing of the first and second substrates with the second pressure to the releasing of the first and second substrates.

In still further embodiments, in the pressing of the first and second substrates with the second pressure, the second resin may have a viscosity of about 100 cps.

In even further embodiments, the forming of the solder bumps may include: disposing a first resin on a top side of at least one of the first and second substrates; and while flowing the first resin, forming solder bumps on first electrodes and/or the second electrodes.

In yet further embodiments, the first resin may include solder powder and a polymer resin which are mixed with a volume ratio of bout 1:9 to about 5:5.

In some embodiments, the first resin may include a first reducing agent so as to remove a natural oxide layer formed on the solder powder.

In other embodiments, the first resin may include a hardener or a catalyst.

In still other embodiments, the forming of the solder bumps may include removing the first resin to expose the solder bumps to air.

In even other embodiments, the second resin may further include a polymer resin in which the spacer balls are mixed with a volume ratio of about 2% to about 4%.

In yet other embodiments, the second resin may further include a second reducing agent so as to remove natural oxide layers formed on the solder bumps.

In other embodiments of the present invention, there are provided structures for bonding a flip chip, the structures including: a first substrate on which a first electrode is disposed; a second substrate on which a second electrode is disposed to face the first electrode, the second substrate being disposed above the first substrate with a predetermined distance from the first substrate; a solder bump connected between the first and second electrodes; and a second resin including a spacer ball disposed between the first and second substrates at a position close to the solder bump so as to maintain the predetermined distance between the first and second substrates.

In some embodiments, the spacer ball may include an elastic plastic material.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Also, though terms like a first, a second, and a third are used to describe various regions, layers, electrodes, and substrates in various embodiments of the present invention, the regions, the layers, electrodes, and substrates are not limited to these terms. These terms are used only to discriminate one region, layer, electrode, or substrate from another region, layer, electrode, or substrate. An embodiment described and exemplified herein includes a complementary embodiment thereof.

Hereinafter, a method and structure for bonding a flip chip will be described with reference to the accompanying drawings according to exemplary embodiments of the present invention.

Figure 1:
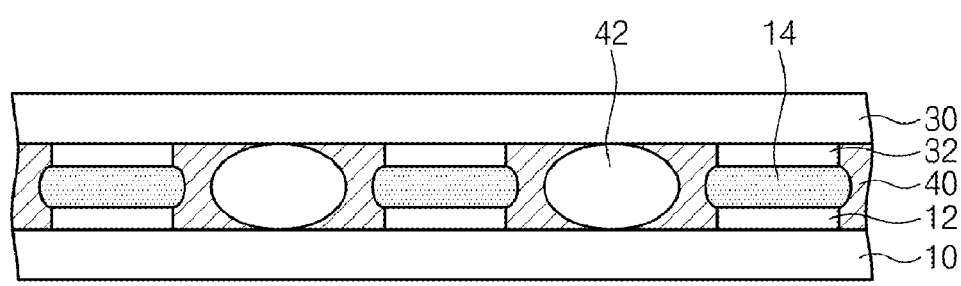
FIG. 1 is a sectional view illustrating a flip chip bonding structure according to an embodiment of the present invention.

FIG. 1 is a sectional view illustrating a structure for bonding a flip chip according to an embodiment of the present invention. The flip chip bonding structure of the current embodiment may include: first and second electrodes 12 and 32 disposed on first and second substrates 10 and 30 that face each other; solder bumps 14 disposed between the first and second electrodes 12 and 32; and spacer balls 42 configured to maintain a gap between the first and second substrates 10 and 30.

The solder bumps 14 may connect the first and second electrodes 12 and 32 electrically. The first electrodes 12, the solder bumps 14, and the second electrodes 32 may form cylindrical pillars having a height of about 1 µm to about 200 µm between the first and second substrates 10 and 30. The first electrodes 12, the solder bumps 14, and the second electrodes 32 may have a diameter of about 5 µm to about 200 µm. The solder bumps 14 may have a hemispheric shape. The spacer balls 42 may have a spherical shape and be disposed around the first and second electrodes 12 and 32 to support the first and second substrates 10 and 30, and the spacer balls 42 may be formed of an elastic plastic material.

The spacer balls 42 may have a diameter greater than the thickness of the first electrodes 12, the solder bumps 14, and the second electrodes 32 connected between the first and second substrates 10 and 30. The spacer balls 42 may be deformed into an ellipsoidal shape when the first and second substrates 10 and 30 are pressed. In addition, if the first and second substrates 10 and 30 are pressed to a margin corresponding to the minimum height (a second level) of the solder bumps 14 which have irregular sizes, the spacer balls 42 may be deformed into an ellipsoidal shape or a disk shape.

In addition, the connection between the first and second substrates 10 and 30 may be maintained by an under-fill layer 40. The under-fill layer 40 may be a second resin filled in a gap between the first and second substrates 10 and 30. The under-fill layer 40 may be a polymer resin including a second reducing agent that fluxes natural oxide layers from metal components of the first electrodes 12, the solder bumps 14, and the second electrodes 32.

Since the flip chip bonding structure of the current embodiment includes the spacer balls 42 that can be deformed from a spherical shape to an ellipsoidal shape or further to a disk shape according to the solder bumps 14 having various heights, connection defects of the solder bumps 14 can be prevented.

A detailed explanation will now be given on a method for fabricating a flip chip bonding structure according to an embodiment of the present invention.

FIGS. 2 through 8 are sectional views for explaining a method for bonding a flip chip according to an embodiment of the present invention.

Figure 2:
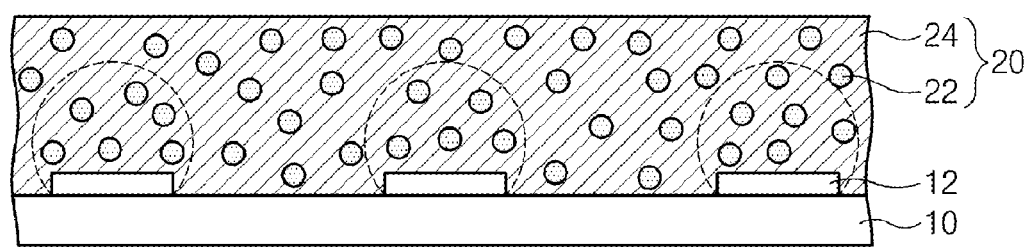
FIGS. 2 through 8 are sectional views for explaining a method for bonding a flip chip according to an embodiment of the present invention.

Referring to FIG. 2, in the flip chip bonding method of the current embodiment, first, a first resin 20 (solder bump maker, SBM) which is a mixture of solder powder 22 and a polymer resin 24 is applied to a first substrate 10 on which first electrodes 12 are disposed. Examples of the first substrate 10 may include a silicon wafer, a PCB, and a ceramic substrate. The first electrodes 12 may be a metal pad layer formed of at least one of titanium (Ti), nickel (Ni), platinum (Pt), and gold (Au). The polymer resin 24 may include a material such as DGEBA, TGDDM, TriDDM, isocyanate, and bismaleimide. The first resin 20 may include a material such as butyl glycidyl ether (BGE), allyl glycidyl ether (AGE) clycidyl phenyl ether (GPE), and silicon oil as a diluent for the polymer resin 24.

In addition, the first resin 20 may further include a first reducing agent for removing an oxide layer formed on the solder powder 22. The first reducing agent may include an acid having a carboxyl group (COOH—) such as glutaric acid, malic acid, azelaic acid, abietic acid, adipic acid, ascorbic acid, acrylic acid, and citric acid.

The solder powder 22 may include at least one of tin (Sn), bismuth (Bi), silver (Ag), copper (Cu), indium (In), and lead (Pb) and may have a particle diameter of about 0.1 µm to about 70 µm. The solder powder 22 may include an alloy having a composition such as 60Sn/40Bi, 52In/48Sn, 97In/3Ag, 57Bi/52Sn/1Ag, 58Bi/42Sn, 52Bi/32Pb/16Sn, and 96.5S/3Ag/0.5Cu. The solder powder 22 and the polymer resin 24 may be mixed with a ratio ranging from about 1:9 to about 5:5.

For example, in the case where the solder powder 22 has a particle diameter of about 1 µm to 60 µm and is formed of 58Sn/48Bi, about 1 volume % to about 60 volume % of the solder powder 22 may be included in the first resin 20 for every 100 parts of the polymer resin 24, and 0 to about 50 parts of a reducing agent may further be included in the first resin 20. This is shown in Table 1 below.

TABLE 1

| Components of first resin | PHR (part per hundred) |
| --- | --- |
| Polymer resin (DGEBA) | 100 |
| Reducing agent (Malic acid) | 0 to 50 |
| Solder powder (58Sn/42Bi, diameter: about 1 to 60 μm) | 1 to 60 Vol. % |

As shown in Table 1, the first resin 20 may include a DGEBA polymer resin 24, a malic reducing agent, and solder powder 22 but may not include a solvent or a convection additive.

The first resin 20 is a mixture of the polymer resin 24 and the solder powder 22. The particle size of the solder powder 22 may be adjusted according to external conditions applied to the solder powder 22. The solder powder 22 may be prepared by atomizing liquid-state molecules having a size of several nanometers to several tens of nanometers into inert gas, so that the solder powder 22 have a size of about several tens of micrometers (μm). Then, the solder powder 22 may be mixed with the polymer resin 24 and stored in a container or applied to the first substrate 10. Thereafter, while the first resin 20 is heated to a temperature equal to or higher than the melting point of the solder powder 22, the first resin 20 may be pulverized by ultrasonic waves into fine particles having a diameter of about 10 μm. The first resin 20 may include a catalyst for accelerating pulverization of the solder powder 22 into fine particles.

Next, the solder powder 22 having a fine size may be fixed in the first resin 20 by cooling the first resin 20. In addition, the first resin 20 may further include a hardener for hardening the solder powder 22 before the solder powder 22 clumps together when the first resin 20 is cooled.

If the solder powder 22 has a composition of 96.5S/3Ag/0.5Cu, the melting point of the solder powder 22 is 220° C. Therefore, the solder powder 22 may be pulverized into fine particles by applying ultrasonic waves to the first resin 20 while heating the first resin 20 to a temperature equal to or higher than 220° C.

In this process, since the solder powder 22 is not exposed to air owning to the polymer resin 24, formation of a natural oxide layer on the solder powder 22 may be minimized. The surface area of the solder powder 22 may vary in inverse proportion to the particle diameter of the solder powder 22. Therefore, since the solder powder 22 mixed with the first resin 20 is pulverized into fine particles according to the flip chip bonding method of the current embodiment, formation of a natural oxide layer on the surface of the fine solder powder 22 may be minimized, and thus the amount of the first reducing agent included in the first resin 20 for removing such a natural oxide layer may be reduced.

For example, if solder powder having a particle diameter of about 40 μm is pulverized into fine particles having a diameter of about 10 μm in the atmosphere, the surface area of the solder powder may be increased by a factor of about 4. Thus, formation of a natural oxide layer on the fine solder powder may also be increased by a factor of about 4. As a result, about four times more amount of the first reducing agent may be included in the first resin 20 for removing a natural oxide layer formed on the surface of fine solder powder. However, according to the current embodiment, since the solder powder 22 is pulverized into fine particles in a state where the solder powder 22 is mixed in the first resin 20, formation of a natural oxide layer may be reduced, and thus the amount of the first reducing agent included in the first resin 20 may also be reduced.

Figure 3:
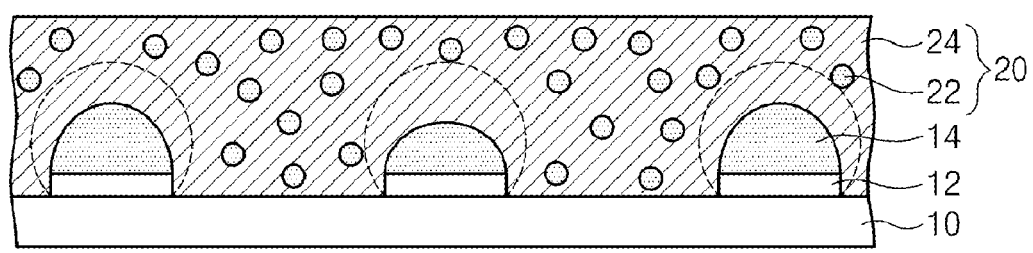

Referring to FIG. 3, while heating the first resin 20 so that the first resin 20 can flow, the solder powder 22 is allowed to self-clump around the first electrodes 12 so as to form solder bumps 14 on the first electrodes 12. The processes illustrated in FIGS. 2 and 3 may be continuously performed.

The solder bumps 14 may be formed by allowing the solder powder 22 to flow in the polymer resin 24 in a state where the first substrate 10 is wet by a flow of the first resin 20. For example, near the first electrodes 12, particles of the solder powder 22 having a metal component may attract each other due to Van der Waal's force acting between molecules of fine particles, and the solder powder 22 may flow toward the first electrodes 12 and clump on the first electrodes 12 by metallic bond to form solder bumps 14. Van der Waal's force may include an attractive force acting between surfaces of fine particles such as atoms, molecules. The metallic bond may include a chemical bond of metal atoms that forms a metal crystal. The first electrodes 12 function as seeds in metallic bond of the solder powder 22 so that the solder bumps 14 can be formed on the first electrodes 12.

The size of the solder bumps 14 may be proportional to the diameter of cross sections (planes) of the first electrodes 12, and the aspect ratio of the solder bumps 14 may range from about 0.5 (a first level) to about 0.1 (a second level). These data can be obtained from an experiment carried out in a condition where the solder powder 22 and the polymer resin 24 of the first resin 20 are mixed with the above-described ratio. For example, if the diameter of circular sections of the first electrodes 12 is about 5 μm, the height of the solder bumps 14 formed on the first electrodes 12 may range from about 2.5 μm (a first level) to about 1.0 μm (a second level). If the diameter of circular sections of the first electrodes 12 is about 200 μm, the height of the solder bumps 14 formed on the first electrodes 12 may range from about 100 μm (a first level) to about 20 μm (a second level). The first electrodes 12 may have a height from about 1 μm to about 200 μm. Alternatively, the first electrodes 12 may have a small size of about 0.1 μm.

According to the flip chip bonding method of the current embodiment, the solder bumps 14 can be formed on the first electrodes 12 by the self clumping of the solder powder 22 included in the first resin 20. As described above, the solder bumps 14 formed on the first electrodes 12 may have irregular sizes.

Thereafter, the first resin 20 may be hardened by cooling of normal temperature (23° C.

Figure 4:
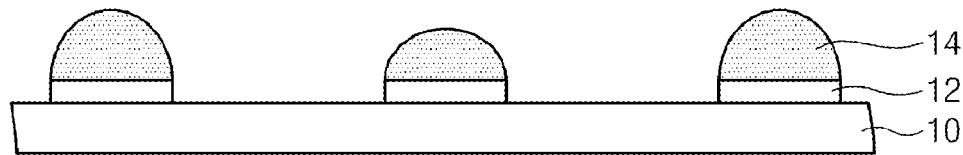

Referring to FIG. 4, the polymer resin 24 may be removed from the first substrate 10 to expose the solder bumps 14 to air. The polymer resin 24 may be removed by using an organic solvent. At this time, the solder powder 22 that has not participated in the process of forming the solder bumps 14 may be removed together with the polymer resin 24 by the organic solvent. The organic solvent may include at least one of acetone, isoprophyl alcohol (IPA), xylene, ethanol, methyl ethyl ketone, cellosove acetate, MEK/toluene, methanol (45%)/dicholromethane (40%)/Distilled water(15%), chloroform, dimethyl sulfoxide (DMSO), tetrahydrofuran (THF), dimethyl formamide (DMF), ethyl acetate, carbon tetrachloride, toluene, benzene, acetic acid, and 1-chlorobenzene.

Figure 5:
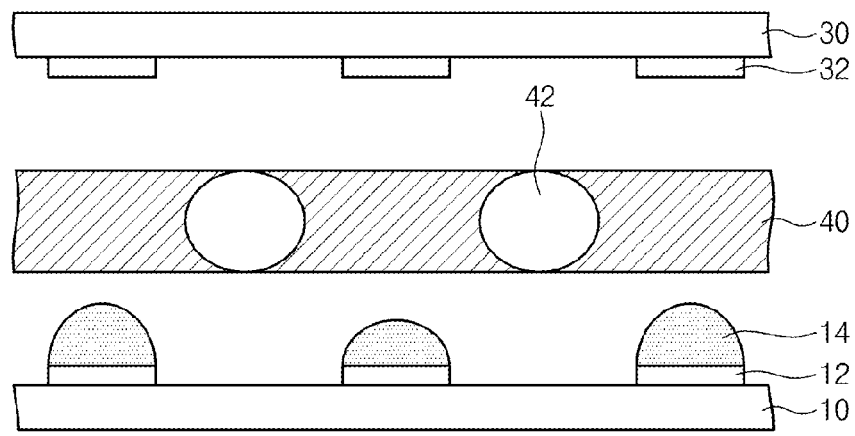

Referring to FIG. 5, an under-fill layer 40 and a second substrate 30 may be aligned above the first substrate 10. The second substrate 30 may include second electrodes 32 that face the first electrodes 12 and the solder bumps 14 disposed on the first substrate 10. The second electrodes 32 may be formed of a metal which is the same as or similar to that used to form the electrodes 12, and the second electrodes 32 may have a height of about 10 μm to about 200 μm. In the flip chip bonding method of the current embodiment, the first substrate 10 and the second substrate 30 may be aligned in a manner such that the first electrodes 12 and the solder bumps 14 face the second electrodes 32.

The under-fill layer 40 may include a polymer resin formed into a thin film or paste as a second resin. In the case where the under-fill layer 40 has a thin film shape, the under-fill layer 40 may be inserted between the first substrate 10 and the second substrate 30. That is, the under-fill layer 40 may be placed on the first electrodes 12 and the solder bumps 14 of the first substrate 10. On the other hand, if the under-fill layer 40 is prepared in the form of paste (not shown), the under-fill layer 40 may be allowed to flow on the top side of the first substrate 10 in a manner such that the first electrodes 12 and the solder bumps 14 are immersed.

As described above, the under-fill layer 40 may include spacer balls 42 formed of an elastic plastic material so as to maintain a gap between the first and second substrates 10 and 30. In the flip chip bonding method of the current embodiment, the under-fill layer 40 may be formed in a manner such that the spacer balls 42 are disposed around the first electrodes 12.

The melting point of the spacer balls 42 may be higher than the melting point of the polymer resin of the under-fill layer 40. The spacer balls 42 may be mixed with the polymer resin at a volume ratio of about 1% to about 10% (specifically, about 2% to about 4%). The under-fill layer 40 may further include a second reducing agent for removing natural oxide layers formed on the first electrodes 12, the solder bumps 14, and the second electrodes 32. Like the first reducing agent, the second reducing agent may include an acid having a carboxyl group (COOH—) such as glutaric acid, malic acid, azelaic acid, abietic acid, adipic acid, ascorbic acid, acrylic acid, and citric acid.

Figure 6:
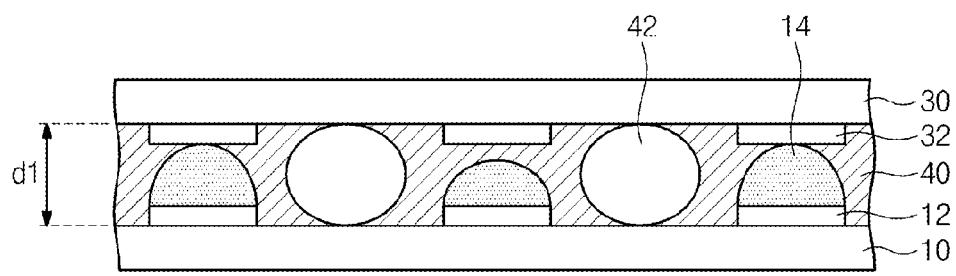

Referring to FIG. 6, while allowing the under-fill layer 40 to flow, the first and second substrates 10 and 30 may be pressed until the first and second substrates 10 and 30 are spaced a first distance d1 from each other so that a solder bump 14 having the maximum height (first level) can be brought into contact with a second electrode 32. The first and second electrodes 12 and 32 may be disposed on the first and second substrates 10 and 30, respectively, and the first and second electrodes 12 and 32 may have a height of about 1 μm to about 200 μm and diameter of about 5 μm to about 200 μm. The maximum height (first level) of the solder bumps 14 may range from about 2.5 μm to about 100 μm according to the diameter of the first electrodes 12. Therefore, the first distance d1 may range from about 4.5 μm to about 500 μm. At this time, the solder bumps 14 may be thicker than the first and second electrodes 12 and 32.

Figure 9:
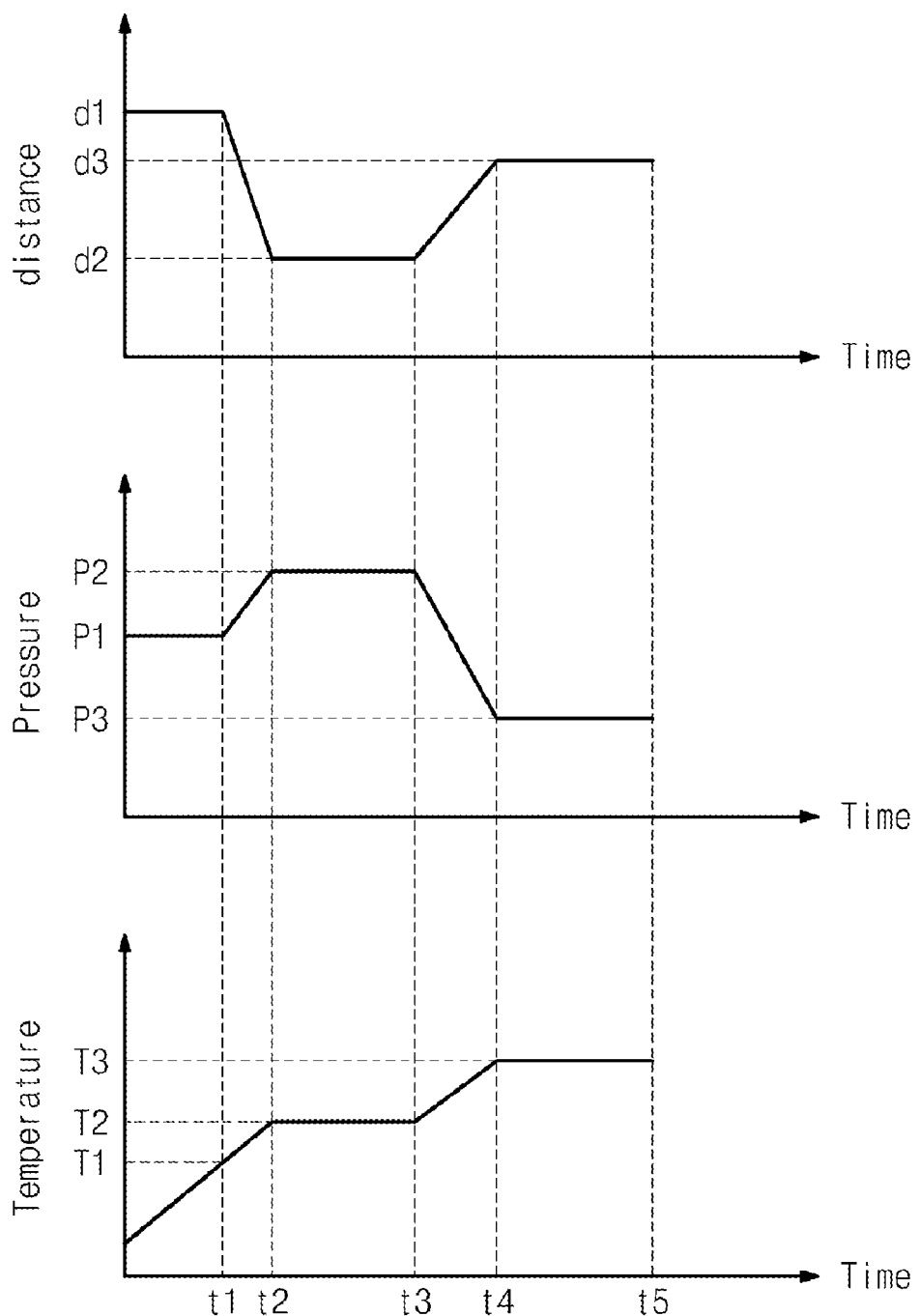
FIG. 9 illustrates relationships among the distance between first and second substrates, pressure applied to the first and second substrates, and temperature of the first and second substrates with respect to flip chip bonding process time according to an embodiment of the present invention.

FIG. 9 illustrates relationships among the distance between the first and second substrates 10 and 30, pressure applied to the first and second substrates 10 and 30, and temperature of the first and second substrates 10 and 30 with respect to flip chip bonding process time according to an embodiment of the present invention. In a period from the start to the first time t1 during which a solder bump 14 having a first level is not yet brought into contact with a second electrode 32, the first and second substrates 10 and 30 are pressed with an approximately constant first pressure P1 in a state where the first and second substrates 10 and 30 are spaced a first distance d1 from each other. At this time, the under-fill layer 40 may be heated from room temperature to a first temperature T1 at which the under-fill layer 40 may start to flow.

Figure 7:
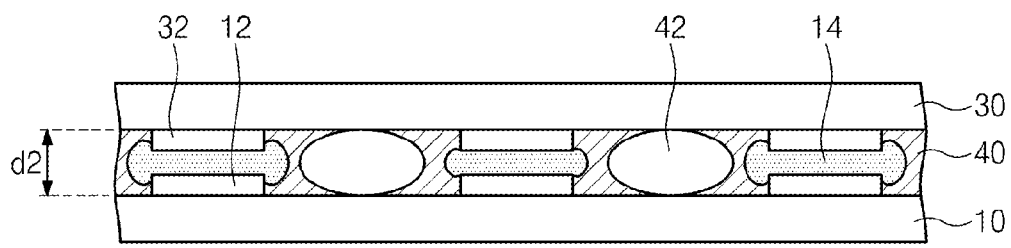

Referring to FIGS. 7 and 9, in a period from the first time t1 to the second time t2, the first and second substrates 10 and 30 may be pressed until the first and second substrates 10 and 30 are spaced a second distance d2 from each other, so as to bring a solder bump 14 having a minimum height (second level) into contact with a second electrode 32. While the first and second substrates 10 and 30 are getting closer from the first distance d1 to the second distance d2, the pressure applied to the first and second substrates 10 and 30 is increased from the first pressure P1 to a second pressure P2, which may be due to the fact that more of the solder bumps 14 of which the height ranges from the maximum height (first level) to the minimum height (second level) are brought into contact with the second electrodes 32. That is, to increase the number of solder bumps 14 making contact with the second electrodes 32 and reduce the height of the solder bumps 14, the pressure applied to the first and second substrates 10 and 30 may be increased.

For example, the second level of the solder bumps 14 may range from about 0.5 μm to about 10 μm according to the diameter of the first electrodes 12. In this case, if each of the first and second electrodes 12 and 32 has a thickness in the range from about 1 μm to about 200 μm, the second distance d2 between the bonded first and second substrates 10 and 30 may range from about 2.5 μm to about 410 μm.

In the flip chip bonding method of the current embodiment, since the first and second substrates 10 and 30 can be pressed until a solder bump 14 having a minimum height (second level) is brought into contact with a second electrode 32 and is further compressed, contact defects of the solder bumps 14 can be prevented.

At this time, the under-fill layer 40 may be in a wet state of about 100 cps at a second temperature T2. As described above, as all the solder bumps 14 formed on the first electrodes 12 are brought into contact with the second electrodes 32, the pressure may become maximum as shown in FIG. 9. Thereafter, in a period from the second time t2 to the third time t3, the first and second substrates 10 and 30 may be spaced the second distance d2 from each other by applying the second pressure P2 to the first and second substrates 10 and 30.

Figure 8:
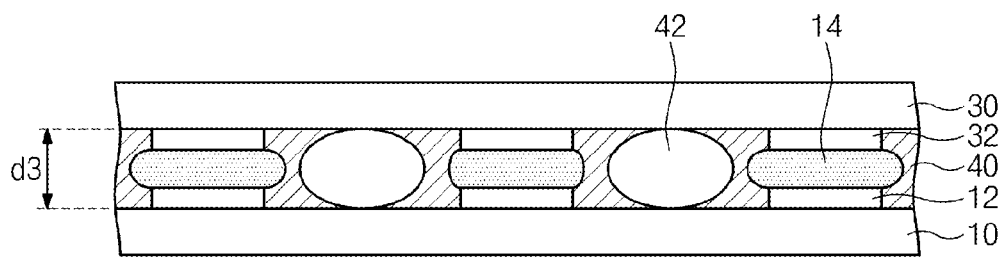

Referring to FIGS. 8 and 9, in a period from the third time t3 to the fourth time t4, while increasing the distance between the first and second substrates 10 and 30 from the second distance d2 to a third distance d3 by releasing the first and second substrates 10 and 30 in a manner such that the pressure reduces from the second pressure P2 to a third pressure P3, the under-fill layer 40 may be hardened. At this time, as the pressure applied to the first and second substrates 10 and 30 is reduced, the distance between the first and second substrates 10 and 30 is increased from the second distance d2 to the third distance d3 by the resilience of the spacer balls 42. For example, the third distance d3 may be greater than the second distance d2 by about 0.1 μm to about 1 μm. At this time, since the spacer balls 42 have a diameter greater than the third distance d3, the spacer balls 42 may have an ellipsoidal or disk shape due to deformation. At this time, as shown in FIG. 9, the under-fill layer 40 is hardened in a state where the pressure is decreased from the second pressure P2 to the third pressure P3, the distance between the first and second substrates 10 and 30 is increased from the second distance d2 to the third distance d3, and the temperature of the first and second substrates 10 and 30 is increased from the second temperature T2 to a third temperature T3.

That is, in the flip chip bonding method of the current embodiment, by using the resilience of the spacer balls 42 disposed between the first and second substrates 10 and 30, the first and second substrates 10 and 30 can be bonded in a state where the first and second substrates 10 and 30 are spaced the constant third distance d3 from each other.

In a period from the fourth time t4 to the fifth time t5, the under-fill layer 40 is almost hardened.

As described above, according to the flip chip bonding method of the current embodiment, the first and second substrates 10 and 30 are pressed until a solder bump 14 having a minimum height is brought into contact with a second electrode 32, and thus contact errors of the solder bumps 14 can be prevented. For example, the solder bumps 14 may be disposed on the second electrodes 32, and then the solder bumps 14 may be brought into contact with the first electrodes 12. In another example, the solder bumps 14 may be disposed on the first and second electrodes 12 and 32, and then the solder bumps 14 may be brought into contact with each other. A person of ordinary skill in the art can fully modify and apply the various cases adopting the technical idea of the present invention based on the detailed description and the exemplary embodiments.

According to the embodiments of the present invention, since a solder bump having a minimum height can be bonded to first and second electrodes by using the first resin including the solder powder, contact defect of the solder bump can be prevented.

In addition, the distance between the first and second substrates can be constantly maintained by using the spacer balls included in the second resin.

What is claimed is:

1. A method for bonding a flip chip, comprising:
    forming solder bumps on first electrodes and/or second electrodes disposed on first and second substrates, respectively;
    arranging the first and second electrodes to face each other with an underfill layer being disposed between the first and second substrates, the underfill layer including spacer balls and a second resin surrounding the spacer balls; and
    while flowing the second resin, pressing the first and second substrates until distance between the first and second substrates is decreased smaller than diameter of the spacer balls, so as to connect the solder bumps between the first and second electrodes,
    wherein each spacer ball comprises an elastic material, and, as the distance between the first and second substrate is decreased during the pressing step, each spacer ball deforms to reduce a height of each spacer ball in a thickness direction of the first and second substrates, and a space between the first and second substrates is filled with the underfill layer.

2. The method of claim 1, wherein the solder bumps have heights ranging from a maximum height to a minimum height.

3. The method of claim 2, wherein the minimum height of the solder bumps corresponds to an aspect ratio of 0.1 with respect to a size of the first electrodes or the second electrodes.

4. The method of claim 2, wherein the maximum height of the solder bumps corresponds to an aspect ratio of 0.5 with reference to a size of the first electrodes or the second electrodes.

5. The method of claim 2, wherein the pressing of the first and second substrates comprises:
    pressing the first and second substrates with a first pressure so that the first and second substrates are spaced a first distance at which a solder bump having the maximum height is brought into contact with the first and second electrodes;
    pressing the first and second substrates with a second pressure higher than the first pressure so that the first and second substrates are spaced a second distance at which a solder bump having the minimum height is brought into contact with the first and second electrodes; and
    releasing the first and second substrates with a third pressure lower than the second pressure so that the first and second substrates are spaced a third distance greater than the second distance.

6. The method of claim 5, wherein in the releasing of the first and second substrates, the first and second substrates are spaced the third distance greater than the second distance by resilience of the spacer balls.

7. The method of claim 5, wherein the second resin is flown from the pressing of the first and second substrates with the first pressure to the pressing of the first and second substrates with the second pressure, and the second resin is hardened from the pressing of the first and second substrates with the second pressure to the releasing of the first and second substrates.

8. The method of claim 7, wherein in the pressing of the first and second substrates with the second pressure, the second resin has a viscosity of about 100 cps.

9. The method of claim 1, wherein the forming of the solder bumps comprises:
    disposing a first resin on a top side of at least one of the first and second substrates; and
    while flowing the first resin, forming solder bumps on first electrodes and/or the second electrodes.

10. The method of claim 9, wherein the first resin comprises solder powder and a polymer resin which are mixed with a volume ratio of bout 1:9 to about 5:5.

11. The method of claim 9, wherein the first resin comprises a first reducing agent so as to remove a natural oxide layer formed on the solder powder.

12. The method of claim 9, wherein the first resin comprises a hardener or a catalyst.

13. The method of claim 9, wherein the forming of the solder bumps comprises removing the first resin to expose the solder bumps to air.

14. The method of claim 1, wherein the second resin comprises a polymer resin in which the spacer balls are mixed with a volume ratio of about 2% to about 4%.

15. The method of claim 1, wherein the second resin further comprises a second reducing agent so as to remove natural oxide layers formed on the solder bumps.

16. The method of claim 1, wherein, as the distance between the first and second substrate is decreased during the pressing step, the spacer balls are deformed from a spherical shape to an elliptical or disk shape.

17. The method of claim 1, wherein, after the pressing of the first and second substrates, a top of each spacer ball comes in contact with a bottom surface of the second substrate and a bottom of each spacer ball comes in contact with a top surface of the second substrate, and the spacer ball does not come in contact with the first electrode or the second electrode.

18. A structure for bonding a flip chip, comprising:
    a first substrate on which a first electrode is disposed;
    a second substrate on which a second electrode is disposed to face the first electrode, the second substrate being disposed above the first substrate with a predetermined distance from the first substrate;
    a solder bump connected between the first and second electrodes; and
    an underfill layer disposed between the first and second substrates, such that a space between the first and second substrates is filled with the underfill layer, the underfill layer including a spacer ball and a second resin surrounding the spacer ball, the spacer ball comprises an elastic material and being disposed at a position close to the solder bump so as to maintain the predetermined distance between the first and second substrates, such that a top of the spacer ball comes in contact with a bottom surface of the second substrate, a bottom of the spacer ball comes in contact with a top surface of the second substrate, and the spacer ball does not come in contact with the first electrode or the second electrode.

19. The structure of claim 18, wherein the spacer ball comprises an elastic plastic material.

20. The structure of claim 18, wherein the spacer ball has a diameter greater than the height of the solder bump.

* * * * *